(12) United States Patent
Park

(10) Patent No.: US 6,972,557 B2
(45) Date of Patent: Dec. 6, 2005

(54) HANDLER FOR TESTING SEMICONDUCTOR DEVICE

(75) Inventor: Chan Ho Park, Chonan-si (KR)

(73) Assignee: Mirae Corporation, Chonan-Si (KR)

( * ) Notice: Subject to any disclaimer, the term of this patent is extended or adjusted under 35 U.S.C. 154(b) by 0 days.

(21) Appl. No.: 10/753,553

(22) Filed: Jan. 9, 2004

(65) Prior Publication Data

US 2004/0216536 A1 Nov. 4, 2004

(30) Foreign Application Priority Data

Apr. 29, 2003 (KR) ............... 10-2003-0027100

(51) Int. Cl.[7] ........................................... G01R 31/26
(52) U.S. Cl. .............................. 324/158.1; 324/765
(58) Field of Search .................................. 324/754, 756, 324/758, 760, 765, 158.1, 73.1; 165/104.33, 165/80.2; 62/132

(56) References Cited

U.S. PATENT DOCUMENTS

| | | | |
|---|---|---|---|
| 5,579,826 A | * | 12/1996 | Hamilton et al. ............ 165/254 |
| 6,104,183 A | * | 8/2000 | Kobayashi et al. ....... 324/158.1 |
| 6,205,799 B1 | * | 3/2001 | Patel et al. ................... 62/132 |
| 6,249,132 B1 | * | 6/2001 | Amemiya ................... 324/760 |
| 6,406,246 B1 | * | 6/2002 | Itoh et al. ................... 414/274 |
| 6,445,203 B1 | | 9/2002 | Yamashita et al. |
| 2004/0051545 A1 | * | 3/2004 | Tilton et al. |

* cited by examiner

Primary Examiner—Vinh Nguyen
Assistant Examiner—Tung X. Nguyen
(74) Attorney, Agent, or Firm—Fleshner & Kim LLP

(57) ABSTRACT

Handler for testing a semiconductor device including a carrier unit for detachably holding, and carrying a plurality of devices, a test board having a plurality of test sockets for respectively coming into contact with the devices held at the carrier unit for testing the devices, a press unit for respectively pressing, and bringing the devices on the carrier unit into contact with the test sockets on the test board when the carrier unit is aligned with the test board, a spray unit for directly, and selectively spraying a high or low temperature gas to surfaces of the devices in contact with the test sockets from a position in a neighborhood of the devices of the carrier unit, to heat or cool the devices to a preset temperature, a gas supply unit for selectively supplying the high or low temperature gas to the spray unit, and a control unit for controlling the gas supply to the spray unit from the gas supply unit, thereby directly spraying high or low temperature gas to a surface of the device without an enclosed chamber for providing a particular temperature environment.

19 Claims, 4 Drawing Sheets

HANDLER FOR TESTING SEMICONDUCTOR DEVICE

This application claims the benefit of the Korean Application No. P2003-0027100 filed on Apr. 29, 2003, which is hereby incorporated by reference.

BACKGROUND OF THE INVENTION

1. Field of the Invention

The present invention relates to handlers for testing a semiconductor device, and more particularly, to a handler for testing a semiconductor device, which enables testing of the semiconductor device under a desired temperature by using, not a chamber for providing a desired high, or low temperature ambient, but very simple system.

2. Background of the Related Art

In general, modular ICs, each having memory, and/or non-memory semiconductor devices connected into a circuitry system on a board, are undergone various test after production before shipment. The handler transfers the semiconductor devices, or the modular ICs (hereafter called as 'device') automatically in the test, wherein a picker robot carries out a process in which, when a tray, or a carrier having the devices thereon is loaded a loading stacker, a picker robot transfers the devices to be tested to a test site, inserts into a test socket, to carry out a required test, again transfers tested devices to an unloading stacker, and places the tested devices on designated trays, classifying the tested devices according to a result of the test.

In general, many of the handlers have a system which enables, not only general performance tests under a room temperature, but also a high temperature, or low temperature test, in which regular operation of the devices are tested under an extreme temperature condition of a high, or low temperature, in a range of +150° C. to −50° C. formed in an enclosed chamber by using electric heater or a liquid nitrogen spraying system.

For an example, on one side of a test site of the test handler for testing the memory semiconductor device or the modular IC, there is a preheat chamber for preheating or precooling a test tray having the semiconductor devices loaded thereon or a carrier having modular ICs loaded thereon to a preset temperature as the test tray or the carrier is moved step by step. On one side of the preheat chamber, there is a test chamber for inserting the preheated, or precooled devices in test sockets on a test board under a preset temperature, for carrying out test. On one side of the test chamber, there is a defrost chamber for restoring states of tested devices to an original room temperature, for carrying out a temperature test as the devices go through the preheat chamber, the test chamber, and the defrost chamber.

However, the forgoing related art handler provided with enclosed chambers to form a high, or low temperature ambient for carrying out the high, or low temperature test have the following problems.

First, the attachment of specially formed thick insulating material on an entire wall of the chamber for prevention of heat exchange between an inside and outside of the chamber increases a production cost of the handler as the insulating material is very expensive, and an overall size of the handler.

Second, with regard to the test tray, or the carrier in the preheat chamber or the defrost chamber that is under a temperature state for a preset time period while moving in steps, a conveyor for moving the test tray or the carrier requires very complicated mechanism, a special structure, and material for operating under extreme temperature ambient, to require difficult fabrication process and a high production cost, and difficult to maintain.

Third, the requirements for heating an entire inside space of the chamber to a desired temperature accurately for testing the devices under the accurate temperature, and maintaining the entire inside space of the chamber at a uniform temperature for setting up a thermal equilibrium between all parts inside of the chamber require, not only supply of much thermal energy, but also much time period, and has a difficulty in controlling an accurate temperature during testing.

Of course, even though there are logic handlers developed and used for testing non-memory semiconductor device, such as a logic device, having, not chamber, but a soaking plate for heating the semiconductor devices, or heating or cooling the device by direct spraying of high, or low temperature air, or the like, or transmitting heat from a heater to a surface of the device held at an index head that holds devices and inserts into a test socket, in a case many devices, such as 64 or 128 devices are loaded on a test tray and tested at a time, like the memory device, the type of heating or cooling in a chamber as above has been only one.

SUMMARY OF THE INVENTION

Accordingly, the present invention is directed to a handler for testing a semiconductor device that substantially obviates one or more of the problems due to limitations and disadvantages of the related art.

An object of the present invention is to provide a handler for testing a semiconductor device, which enables uniform, fast, and accurate heating/cooling of a plurality of devices, such as semiconductor devices or modular IC to a preset temperature, and testing of the semiconductor devices under the preset temperature not by using an enclosed chamber for providing the preset high, or low temperature ambient.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the handler for testing a semiconductor device including a carrier unit for detachably holding, and carrying a plurality of devices, a test board having a plurality of test sockets for respectively coming into contact with the devices held at the carrier unit for testing the devices, a press unit for respectively pressing, and bringing the devices on the carrier unit into contact with the test sockets on the test board when the carrier unit is aligned with the test board, a spray unit for directly, and selectively spraying a high or low temperature gas to surfaces of the devices in contact with the test sockets from a position in a neighborhood of the devices of the carrier unit, to heat or cool the devices to a preset temperature, a gas supply unit for selectively supplying the high or low temperature gas to the spray unit, and a control unit for controlling the gas supply to the spray unit from the gas supply unit.

Thus, the direct spray of the high or low temperature gas to a surface of the device from a neighborhood of the device without a chamber for providing a high or low temperature environment permits, not only to shorten a time period required for heating or cooling the device to the desired temperature substantially, but also to simplify an entire structure of the handler, reduce fabrication cost, and easy maintenance because the chamber is required no more, to remove parts related to the chamber too, to make entire structure of the handler very simple.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
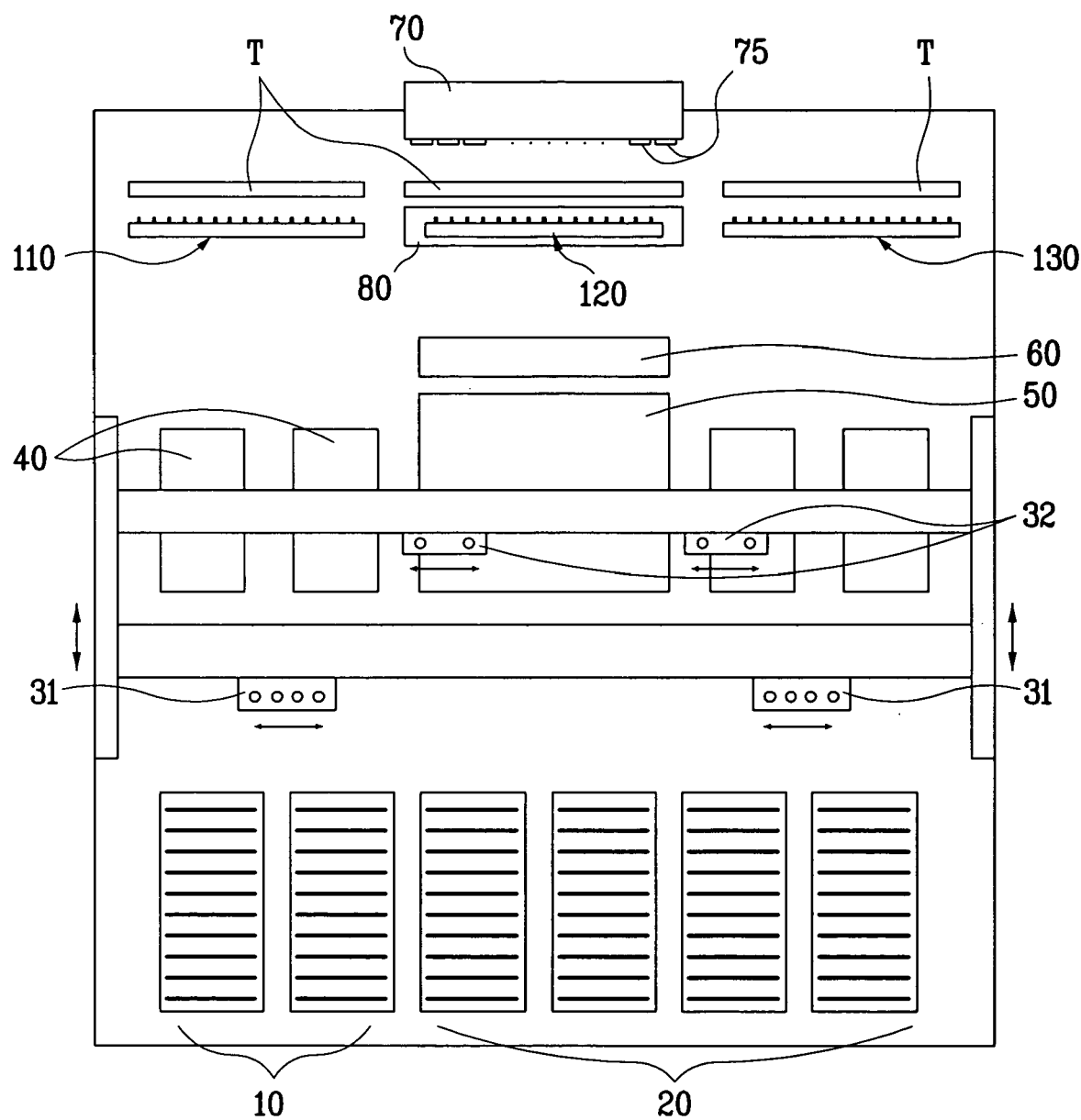
FIG. 1 illustrates a plan view of a handler in accordance with a preferred embodiment of the present invention, schematically.

Reference will now be made in detail to the preferred embodiments of the present invention, examples of which are illustrated in the accompanying drawings. FIG. 1 illustrates a plan view of a handler in accordance with a preferred embodiment of the present invention, schematically.

Referring to FIG. 1, the handler includes loading stackers in a front part of a body for stacking general trays each having a plurality of devices to be tested loaded thereon, and unloading stackers 20 on one side of the loading stackers 10 for placing tested devices on general trays, classifying tested devices according to a tested result.

There are buffer parts 40 movable back and forth in opposite side parts of a middle part of the handler for temporary loading of the devices from the loading stackers 10, and an exchange part 50 between the opposite buffer parts 40 for transferring devices from the buffer parts 40 to a carrier unit, such as a tray 'T', and vice versa. Unexplained reference numeral 60 represents a carrier for carrying the test trays between test sites in rear of the exchange part 50.

There are first picker robot 31 and a second picker robot 32 between the front part of the handler having the loading stacker 10 and the unloading stacker 20 arranged thereon and the middle part of the handler the exchange part 50 and the buffer parts 40 arranged thereon for making linear movement in X-, and Y-axis directions, and picking up and transferring the devices, wherein the first picker robot moves between the loading stacker 10 and the unloading stacker 20, and the buffer parts 40, to transfer the devices, and the second picker robot 32 moves between the buffer parts 40 and the exchange part 50, to transfer the devices.

There is a test board 70 in a rear part of the handler having a plurality of test sockets 75 each for bringing each of the devices 'D' on the test tray into contact thereto to have the test done, wherein the test board 70 serves as an interface for connection to a tester arranged outside of the handler body for testing a performance of the device.

There is a preheating/precooling spray unit 110 in one side part of the test board 70 for heating or cooling the devices to a preset temperature before the test tray is proceeded to, and aligned with a position of the test board 70.

There is a press unit 80 in a front part of, and close to the test board 70 for pressing, and connecting the devices 'D' on the test tray 'T' to the test sockets 75 on the test board 80 when the test tray is proceeded to, and aligned with the test board 70. The press unit 80 has a testing spray unit 120 for spraying a high temperature or low temperature gas to the devices 'D' on the test tray 'T' to maintain a temperature of the devices 'D' to a preset state.

There is a frosting/defrosting spray unit 130 in the other side part of the test board 70 for spraying a low temperature or a high temperature gas opposite to a case of test to surfaces of the devices for returning the tested high temperature, or low temperature devices to an initial room temperature.

Figure 2:
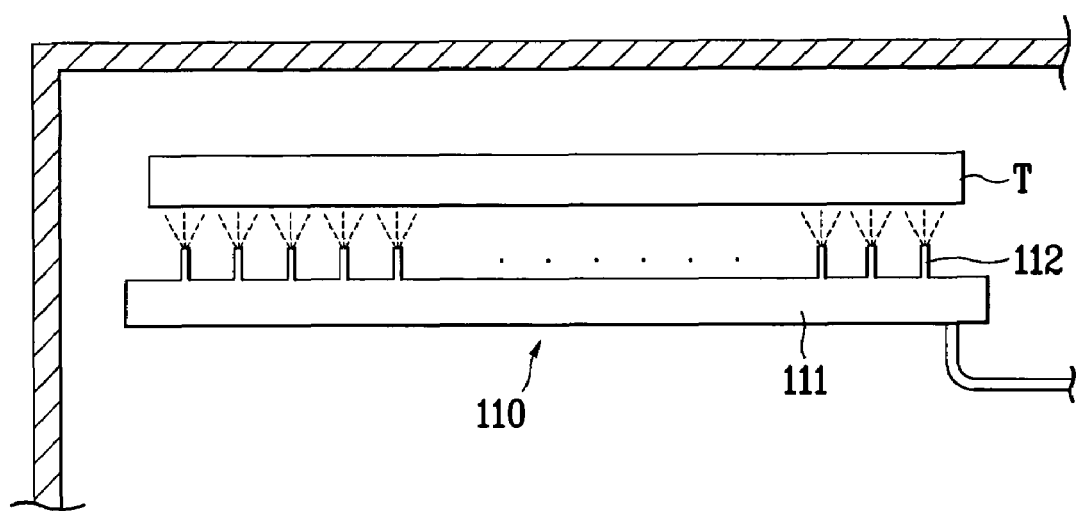
FIG. 2 illustrates a section of key parts showing the preheating/precooling part in the handler in FIG. 1, schematically.
Figure 3:
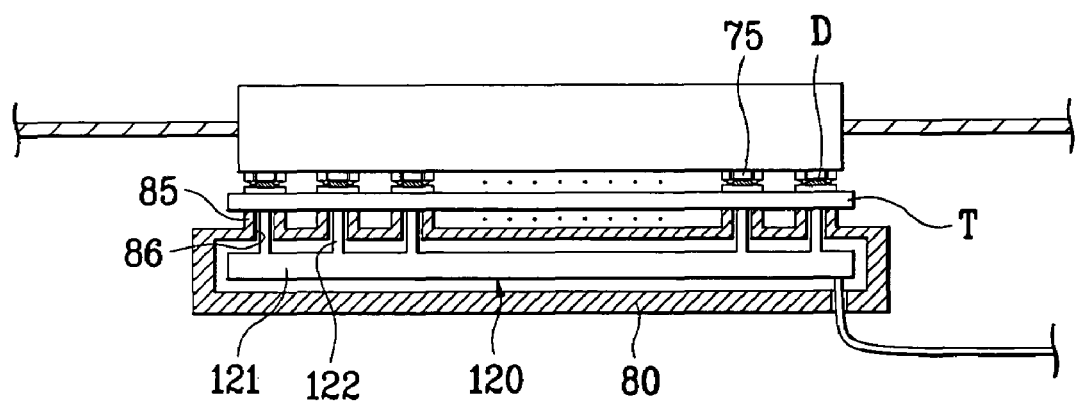
FIG. 3 illustrates a section of key part showing the testing part of the handler in FIG. 1, schematically.
Figure 4:
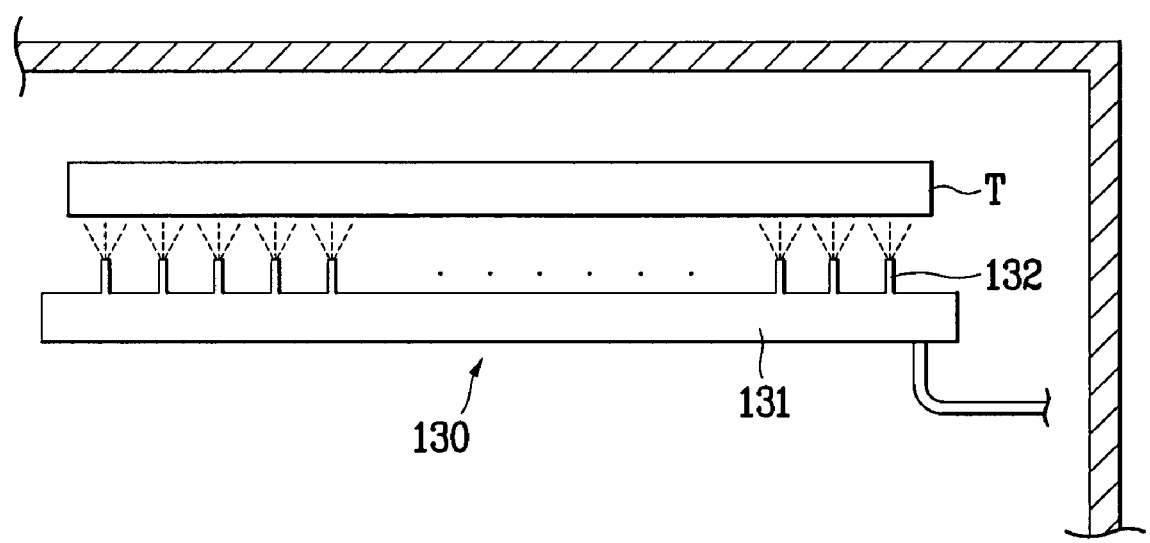
FIG. 4 illustrates a section of key part showing the defrosting/frosting part of the handler in FIG. 1, schematically.

In the meantime, referring to FIGS. 2 to 4, the preheating/precooling spray unit 110, the testing spray unit 120, and the frosting/defrosting spray unit 130 respectively have distribution headers 111, 121, and 131 for having the high temperature, or low temperature gas supplied thereto from a gas supply unit 140 in common for heating or cooling, and nozzles 112, 122, and 132 extended from the distribution headers 111, 121, and 131 toward a direction where the devices are positioned for spraying the supplied gas to the surfaces of the devices 'D'. The testing spray unit 120 has nozzles 122 each extended toward, and opposite to a device 'D' through one of through holes 86 in respective contact projections 85 on the press unit 80.

Figure 5:
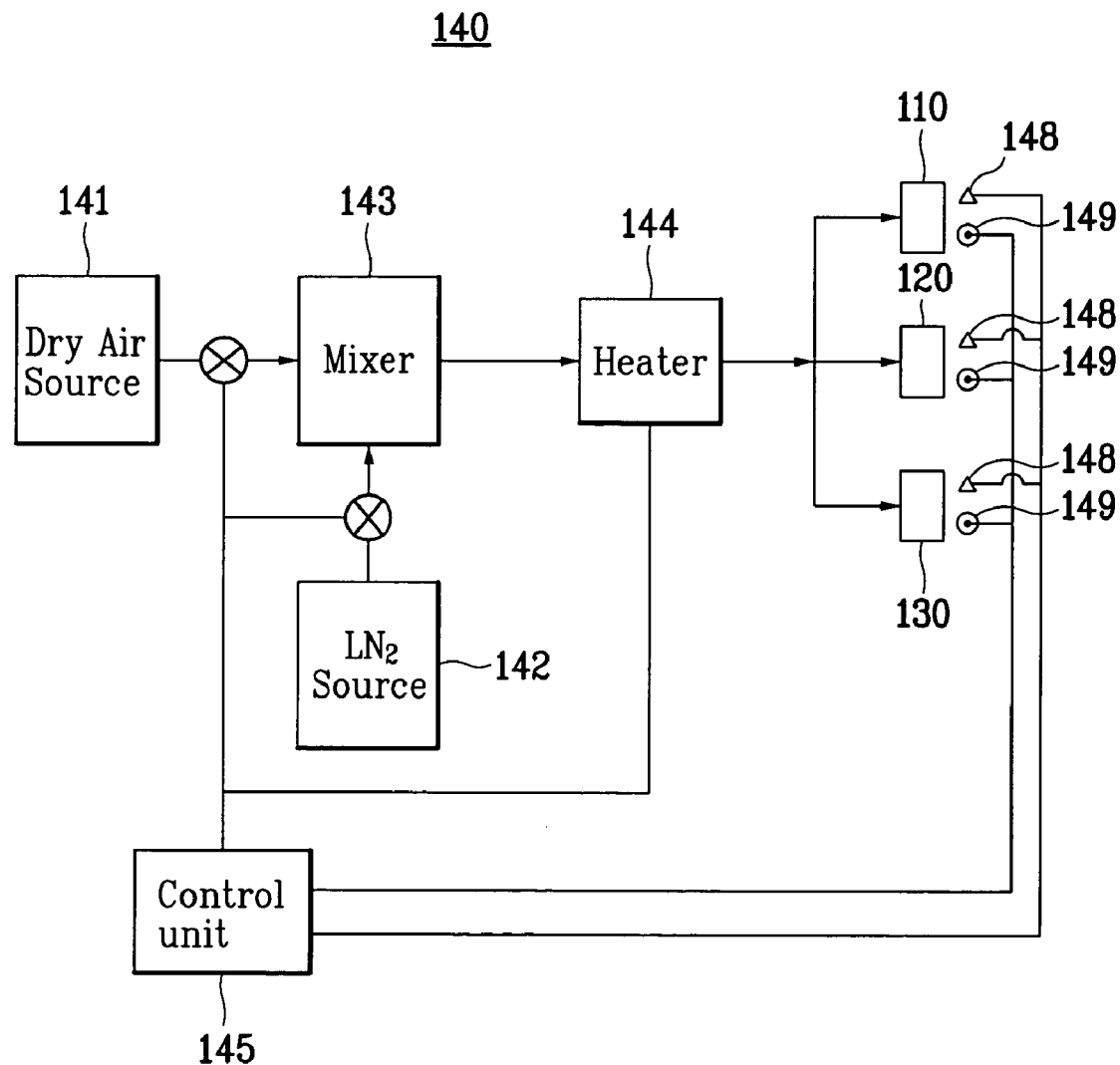
FIG. 5 illustrates a block diagram of a system for supplying heating or cooling gas to respective spraying units in the handler in FIG. 1.

Referring to FIG. 5, the gas supply unit 140 includes a dry air source 141 for supplying dry air, a liquefied nitrogen source 142 for supplying liquefied nitrogen $LN_2$ for cooling, a mixer 143 for mixing the dry air from the dry air source 141 and the liquefied nitrogen from the liquefied nitrogen source 142 uniformly, a heater 144 for heating the dry air from the dry air source 141 in a high temperature test, and a control unit 145 for controlling the supply of the dry air and the liquefied nitrogen from the dry air source 141 and the liquefied nitrogen source 142, and operation of the heater 144. The heater 144 is connected to respective spray units 110, 120, and 130.

In the meantime, there are a plurality of temperature sensors 148 at one side of the spray units 110, 120, and 130 respectively, each for measuring a temperature of a high, or low temperature gas from the nozzle 112, 122, or 132, and transmitting to the control unit 145. The control unit 145 controls supply of the high or low temperature gas through the spray units 110, 120, and 130 according to information on temperatures of the gases from the temperature sensors 148.

There are a plurality of heat compensating temperature sensors 149 at the test sockets 75 or the press unit 80 of the test board 70 each for coming into contact with a surface of the device 'D' inserted in the test socket 75, measuring an actual temperature of the device 'D', and transmitting the actual temperature to the control unit 145.

In the meantime, though the gas supply unit for supplying high/low temperature gas to respective spray units 110, 120, and 130 may have one common line, it is preferable that separate gas supply units are provided to respective spray units 110, 120, and 130 independently, for independent supply of the high temperature/low temperature gases.

The operation of the handler for testing a semiconductor device will be described.

Upon putting the handler into operation, the first picker robot 31 picks up the devices from a general tray at the loading stacker 10, transfers to the buffer parts 40, and then, the second picker robot 32 picks up the devices from the buffer parts 40, transfers to the exchange part 50, and loads the devices on the test tray 'T' at the exchange part 50.

The test tray 'T' having the devices loaded thereon is transferred to front of the preheating/precooling spray unit 110 by a conveyor (not shown).

Then, the high, or low temperature gas is supplied to the preheating/precooling unit 110 through the gas supply unit 140, wherein, in a low temperature test, the liquefied nitrogen $LN_2$ and the dry air are supplied from the liquefied gas source 142 and the dry air source 141 of the gas supply unit 140 to the mixer 143, mixed therein appropriately, and supplied to the preheating/precooling spray unit 110 in a state the heater 144 is not operated, and, in a high temperature test, while the liquefied nitrogen $LN_2$ is not supplied, only the dry air from the dry air source 141 passes through the mixer 143, is heated at the heater 144, and supplied to the preheating/precooling spray unit 110.

The high, or low temperature gas supplied to the distribution header of the preheating/precooling spray unit 110 is sprayed to the devices on the test tray 'T' through the nozzles at a preset pressure, to heat/cool the devices, when the sprayed high, or low temperature gas encloses the devices to form an air curtain, such that the devices are heated or cooled only by the sprayed gas, without any influence from an external air.

When the devices come to a preset temperature state by the preheating/precooling spray unit 110, the test tray is transferred to, and aligned with a position between the test board 70 and the press unit 80 by a conveyor, and then, the press unit 80 moves forward to bring the devices 'D' on the test tray 'T' into contact with the test socket 75, and carry out the test.

In this instance, as the gas is supplied to the testing spray unit 120 through the gas supply unit 140 in the same fashion with the gas supply to the preheating/precooling unit 110, and the gas is sprayed to the devices 'D' through the nozzles of the testing spray unit 120, the devices 'D' can be maintained at a desired temperature.

In the meantime, during the testing, since the device 'D' itself generates heat, that may cause to fail to the test of the device at an exact temperature the user desires, a heat compensation is required, in which a temperature of the device 'D' is cooled down to the desired temperature.

The heat compensation can be made by increasing a flow rate of the liquefied nitrogen of the low temperature gas spray through the testing spray unit 120 in a case of the low temperature test, and opposite to this, the heat compensation can be made by cutting off supply of the high temperature gas, and spraying a low temperature mixed gas of the liquefied nitrogen and the dry air through the testing spray unit 120 in a case of the high temperature test.

The heat compensation can be determined as the control unit 145 receives temperature information from the heat compensating temperature sensor 149 which detects a temperature of a surface of the device 'D' under test.

In the meantime, when the test is finished, the press unit 80 moves back such that the devices 'D' move away from, and are released from the contact to the test socket 75 of the testing board 70, and then, the conveyor (not shown) transfers the test tray 'T' to a position of the frosting/defrosting spray unit 130 on one side thereof.

The frosting/defrosting spray unit 130 restores a temperature of the device to the room temperature, and removes frost by spraying gas in a temperature state opposite to the temperature of the device to the device heated or cooled to a required temperature.

That is, in the high temperature test, the frosting/defrosting spray unit 130 sprays the low temperature gas to make the device at a high temperature to the room temperature, and in the low temperature test, the frosting/defrosting spray unit 130 sprays the high temperature, or room temperature gas to elevate the temperature of the device, and remove frost therefrom.

After the devices restore room temperature by the frosting/defrosting spray unit 130, the test tray 'T' is transferred to the exchange part 50, the second picker robot 32 picks up the devices from the exchange part 50, and transfers from the exchange part 50 to the buffer parts 40, and the first picker robot 31 transfers tested devices from the buffer parts 40 to the unloading stacker 20, and loads the tested devices on general trays at the unloading stacker 20, classifying the tested devices according to a result of test.

In a case the device is tested under the room temperature as it is without the temperature test, the test tray is transferred, not to the preheating/precooling unit 110, but to the test board 70 directly, and the test is carried out. Then, the test tray 'T' is transferred, not to the frosting/defrosting spray unit 130, but to the exchange part 50 directly, and a test is carried out.

As has been described, in the temperature test, the direct spray of the high, or low temperature gas to surfaces of the devices on the teat tray 'T' from respective spray units 110, 120, and 130 can reduce time periods required for heating or cooling the devices to desired temperatures, significantly.

In the temperature test, even though the devices on the test tray is preheated/precooled to a required temperature by the preheating/precooling spray unit 110, transferred to, and tested at the test board 70, and restored to an initial room temperature state, different from this, without the preheating/precooling spray unit and the frosting/defrosting spray unit, the devices may be heated or cooled to a required temperature from the room temperature at the testing spray unit directly, and tested, and, after the test is finished, a gas in an opposite state may be supplied to the testing spray unit, to restore the devices to the room temperature.

In this case, even though there is an advantage in that the system of the handler is simplified substantially, and the size is made compact, since a time period required at the test board increases, the productivity may become poor.

Even though the testing spray unit 120 carries out the heat generating compensation during testing too, a heat generation compensating spray unit and a gas supply unit for supplying high/low temperature gas to the heat generation compensating spray unit may be provided to the press unit 80 together with the testing spray unit 120, for carrying out the heat generation compensation.

Though the gas supply unit 140 has a heater 144 provided on a line connected to the mixer 143 for producing high temperature heater, a separate line may be connected to the dry air source 141 and the heater may be connected to the heater for leading the gas passed through the heater to the spray unit directly, so that a line for supplying a low temperature gas is separated from a line for supplying a high temperature gas.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

As has been described, the direct spray of the high or low temperature gas to a surface of the device from a neighborhood of the device without a chamber for providing a high or low temperature environment permits, not only to shorten a time period required for heating or cooling the device to the desired temperature substantially, but also to simplify an entire structure of the handler, reduce fabrication cost, and easy maintenance because the chamber is required no more, to remove parts related to the chamber too, to make entire structure of the handler very simple.

The present invention is very favorably applicable to a handler which can test 16~128 devices, such as memory semiconductor devices, at a time.

Since the device temperature can be controlled by controlling a flow rate of gas sprayed to the device through respective spray units, the control of the device temperature is very easy.

What is claimed is:

1. A handler for testing a semiconductor device comprising:
   a carrier unit for detachably holding, and carrying a plurality of devices;
   a test board having a plurality of test sockets for respectively coming into contact with the devices held at the carrier unit for testing the devices;
   a press unit for respectively pressing, and bringing the devices on the carrier unit into contact with the test sockets on the test board when the carrier unit is aligned with the test board;
   a spray unit for directly, and selectively spraying a high or low temperature gas to surfaces of the devices in contact with the test sockets from a position in a neighborhood of the devices of the carrier unit, to heat or cool the devices to a preset temperature;
   a gas supply unit for selectively supplying the high or low temperature gas to the spray unit; and
   a control unit for controlling the gas supply to the spray unit from the gas supply unit.

2. The handler as claimed in claim 1, further comprising a preheating/precooling spray unit for directly, and selectively spraying high or low temperature gas to the surfaces of the devices on the carrier unit before the carrier unit is transferred to a position of the test board, to preheat or precool the devices to a preset temperature.

3. The handler as claimed in claim 1, further comprising a frosting/defrosting spray unit for selectively spraying high or low temperature gas to the devices after the testing of the devices on the carrier unit is finished, and the carrier unit moves away from the test board position, to restore the devices into an initial room temperature state.

4. The handler as claimed in claim 1, wherein the gas supply unit includes;
   a dry air source for supplying dry air,
   a liquefied nitrogen source for supplying liquefied nitrogen for cooling,
   a mixer for mixing the dry air from the dry air source and the liquefied nitrogen from the liquefied nitrogen source, and forwarding the spray units, and
   a heater for heating the dry air from the dry air source and forwarding to the spray unit.

5. The handler as claimed in claim 4, wherein the heater is arranged on a line between the mixer and the spray unit.

6. The handler as claimed in claim 4, further comprising a temperature sensor for measuring a temperature of gas sprayed through the spray unit, and transmitting the temperature to the control unit.

7. The handler as claimed in claim 4, further comprising a heat generation compensating temperature sensor for bringing into contact with a surface of the device to measure a temperature of the device under test, and transmit the temperature to the control unit, when the device is come into contact with the test socket.

8. The handler as claimed in claim 1, wherein the spray unit includes;
   a distribution header on one side part of the press unit for having high or low temperature gas supplied thereto from an outside of the spray unit, and
   a plurality of nozzles extended from the distribution header toward the devices on the carrier unit for spraying the gas supplied thereto.

9. A handler for testing a plurality of semiconductor devices with test sockets of a test board, comprising:
   at least one cooling/heating unit for direct spraying of a fluid to surfaces of the semiconductor devices to set the devices to a preset temperature, to carry out a temperature test and heat generation compensation; and
   a carrier unit for detachably mounting the plurality of semiconductor devices, wherein the carrier unit is configured to be movably disposed in a space between the test board and the at least one cooling/heating unit to electrically couple/uncouple the semiconductor devices to/from the test sockets.

10. The handler of claim 9, further comprising a displacement unit having a plurality of projections for displacing the carrier unit in a direction of the test board to electrically couple/uncouple the semiconductor devices to/from the test sockets.

11. The handler of claim 10, wherein at least some of the projections have through holes.

12. The handler of claim 11, wherein the at least one cooling/heating unit comprises a plurality of spray nozzles configured to be at least partially inserted in the through holes.

13. The handler of claim 11, wherein sprayed fluid is communicated through the through holes and through openings in the carrier unit to the surfaces of the semiconductor devices.

14. A system for controlling a temperature of a semiconductor device having a first surface and an opposing second surface, comprising:
   a carrier unit for removably mounting a plurality of semiconductor devices on a mount portion of the first surface;
   a socket array unit having a plurality of test sockets for electrically connecting to the semiconductor devices, wherein the second surface confronts the socket array unit; and
   a fluid dispensing unit for applying a fluid to the first surfaces of the plurality of semiconductor devices to control a temperature of the plurality of semiconductor devices,
   wherein the carrier unit has a plurality of openings respectively registered to a portion of the first surfaces of the plurality of semiconductor devices.

15. The system of claim 14, wherein the fluid is conveyed through the plurality of openings.

16. The system of claim 14, wherein the system further comprises a displacement unit for displacing the carrier unit relative to the socket array unit for electrically connecting the semiconductor devices to the test sockets.

17. The system of claim 16, wherein the displacement unit and the fluid dispensing unit are integrally formed.

18. The system of claim 14, wherein the carrier unit is configured to be disposed between the socket array unit and the fluid dispensing unit.

19. The system of claim 14, wherein the applied fluid is configured to control the temperature of the semiconductor device before, during, or after testing of the semiconductor device, or any combination thereof.

* * * * *